United States Patent
Hsu et al.

(10) Patent No.: US 6,953,725 B2
(45) Date of Patent: Oct. 11, 2005

(54) METHOD FOR FABRICATING MEMORY DEVICE HAVING A DEEP TRENCH CAPACITOR

(75) Inventors: Ping Hsu, Taipei (TW); Kuo-Chien Wu, Miaoli (TW)

(73) Assignee: Nanya Technology Corp., Taoyuan (TW)

( * ) Notice: Subject to any disclaimer, the term of this patent is extended or adjusted under 35 U.S.C. 154(b) by 0 days.

(21) Appl. No.: 10/604,763

(22) Filed: Aug. 14, 2003

(65) Prior Publication Data

US 2004/0253785 A1 Dec. 16, 2004

(30) Foreign Application Priority Data

Jun. 10, 2003 (TW) ........................................ 92115650 A

(51) Int. Cl.[7] ........................................... H01L 21/8242
(52) U.S. Cl. ........................ 438/245; 438/248; 438/247; 438/388; 438/390; 438/391; 257/304
(58) Field of Search ................................. 438/243, 245, 438/387, 390, 248, 247, 386, 391, 388, FOR 430, 389, 347, 348, 244; 257/304, E27.092, E29.346, E21.651

(56) References Cited

U.S. PATENT DOCUMENTS

| | | | | |
|---|---|---|---|---|
| 5,214,603 A | * | 5/1993 | Dhong et al. ................ | 365/207 |
| 6,140,175 A | * | 10/2000 | Kleinhenz et al. .......... | 438/243 |
| 6,184,107 B1 | * | 2/2001 | Divakaruni et al. ........ | 438/427 |
| 6,599,825 B2 | * | 7/2003 | Park ........................... | 438/618 |
| 6,828,192 B2 | * | 12/2004 | Gustin et al. ............... | 438/249 |
| 2003/0013259 A1 | * | 1/2003 | Chidambarrao et al. .... | 438/301 |

* cited by examiner

Primary Examiner—George Fourson
Assistant Examiner—Julio J. Maldonado
(74) Attorney, Agent, or Firm—Jianq Chyun IP Office

(57) ABSTRACT

A method of fabricating a memory device having a deep trench capacitor is described. A first conductive layer is formed in the lower and middle portions of a deep trench in a substrate. An undoped semiconductor layer is formed in the upper portion of the deep trench. A mask layer is formed on the substrate, wherein the mask layercovers the periphery of the undoped semiconductor layer that is adjacent to the neighboring region, pre-defined for the active region of the deep trench. An ion implantation process is performed to implant dopants into the undoped semiconductor layer exposed by the mask layer so as to form a second conductive layer. The first and the second conductive layers constitute the upper electrode of the deep trench capacitor.

19 Claims, 14 Drawing Sheets

METHOD FOR FABRICATING MEMORY DEVICE HAVING A DEEP TRENCH CAPACITOR

CROSS REFERENCE TO RELATED APPLICATIONS

This application claims the priority benefit of Taiwan application serial no. 92115650, filed on Jun. 10, 2003.

BACKGROUND OF INVENTION

1. Field of the Invention

The present invention relates to a fabrication method for a memory device. More particularly, the present invention relates to memory device with a deep trench capacitor.

2. Description of Related Art

Along with the miniaturization of devices, the dimensions of devices progressively diminish. As for a memory device that comprises a capacitor, the space for forming a capacitor also gradually reduces. A deep trench capacitor memory device which uses the space in the substrate to form a capacitor to render a greater area. A deep trench capacitor memory device thus conforms to the demands of the current market.

A conventional fabrication method for a deep trench capacitor memory device includes depositing multi layers of doped polysilicon layer to form an upper electrode. The upper most doped polysilicon layer is formed by forming a layer of non-crystalline silicon layer, followed by delivering an arsenic gas into the reaction chamber for arsenic to be adsorbed onto the non-crystalline silicon layer. An undoped polysilicon layer is further deposited. Thereafter, in a subsequent thermal process, dopants are driven-in to the undoped polysilicon layer to transform the non-crystalline silicon layer into a polysilicon layer.

In the above conventional method, during the diffusion of the arsenic ions that are being adsorbed on the non-crystalline silicon layer to the polysilicon layer, the arsenic ions may also diffuse into the substrate surrounding the deep trench. The substrate around the deep trench, as a result, also comprises the arsenic dopants. Therefore, in the subsequent definition of an active region, the active region may be shifted to the peripheral of the deep trench when a misalignment occurs. Since the channel region of the active region, which is positioned in the peripheral region of the deep trench, could have a high concentration of the arsenic dopants, the sub-threshold voltage of a subsequently formed gate is generated and the normal on-and-off of the device can not be operated. If a capacitor is to be fabricated according to the original dimension of the deep trench, and the problems related to the misalignment, when the active region is defined, are to be avoided, the overlay margin would become very small. In order to increase the overlay margin, one conventional approach is to reduce the dimension of the deep trench. However, the reduction of the deep trench would lead to the generation of the loading effect, which would limit the depth of the trench, and affect ultimately the capacity of the capacitor.

SUMMARY OF INVENTION

The present invention provides a fabrication method of a deep trench capacitor memory device, in which the overlay margin can be increased.

The present invention also provides a fabrication method for a memory device having a deep trench capacitor, wherein the dimension of the capacitor can be larger.

The present invention further provides a fabrication method of a memory device having a deep trench capacitor, in which a first conductive layer is formed in the bottom and the middle parts of the deep trench in the substrate. An undoped semiconductor layer is formed in the top part of the deep trench. A mask layer is then formed on the substrate, wherein the mask layer covers the undoped semiconductor layer at the border of the deep trench adjacent to the region for forming the active region. Thereafter, an ion implantation is conducted to implant dopants to the undoped semiconductor layer that is not covered by the mask layer and to form a second conductive layer. The second conductive layer and the first conductive layer together form the electrode of the capacitor.

In accordance to one aspect of the present invention, the aforementioned second conductive layer is sandwiched in between the undoped semiconductor layer. The undoped semiconductor layer thus serves as a buffer layer, which can prevent the dopants in the second conductive layer to diffuse directly to the substrate at the peripheral of the deep trench. As a result, during the subsequent definition of the active region, a larger overlay margin is provided. Therefore, even there are errors in alignment, the defined active region positioned at the peripheral of the deep trench is precluded from the sub-threshold voltage problem generated due to the diffusion of dopants as in the prior art.

Accordingly, the fabrication method of a memory device, wherein the overlay margin can be increased.

Further, since the present invention can provide a larger overlay margin, the reduction of the dimension of the capacitor is precluded.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention can be better understood by way of the following example which is representative of a preferred embodiment but which is not to be construed as limiting the scope of the invention.

Figure 1:
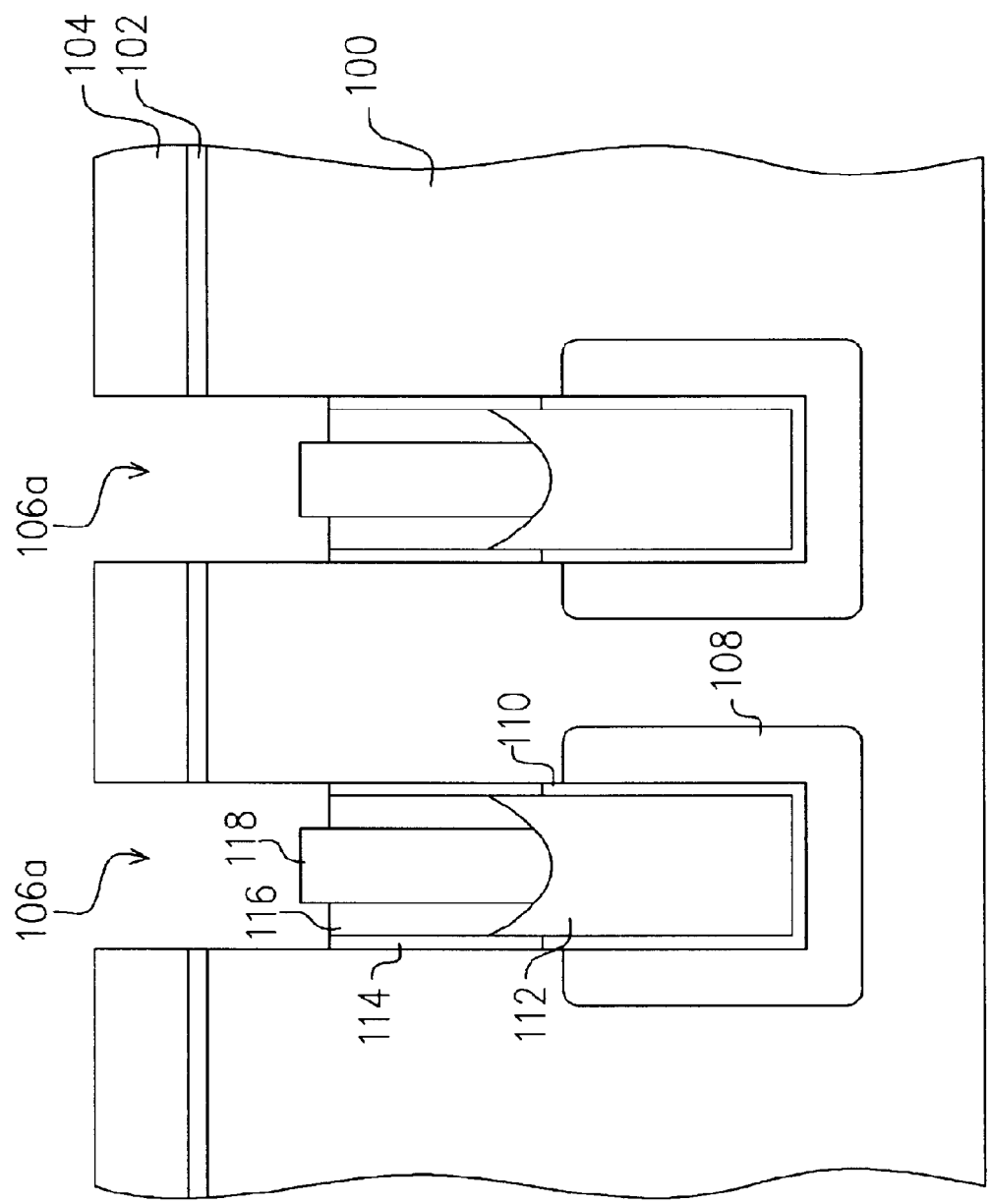
FIGS. 1, 3, 4, 6, 7, 9, 11–13 are schematic, cross-sectional view diagrams illustrating the fabrication process of a memory device having a trench according to an aspect of the present invention.
Figure 2:
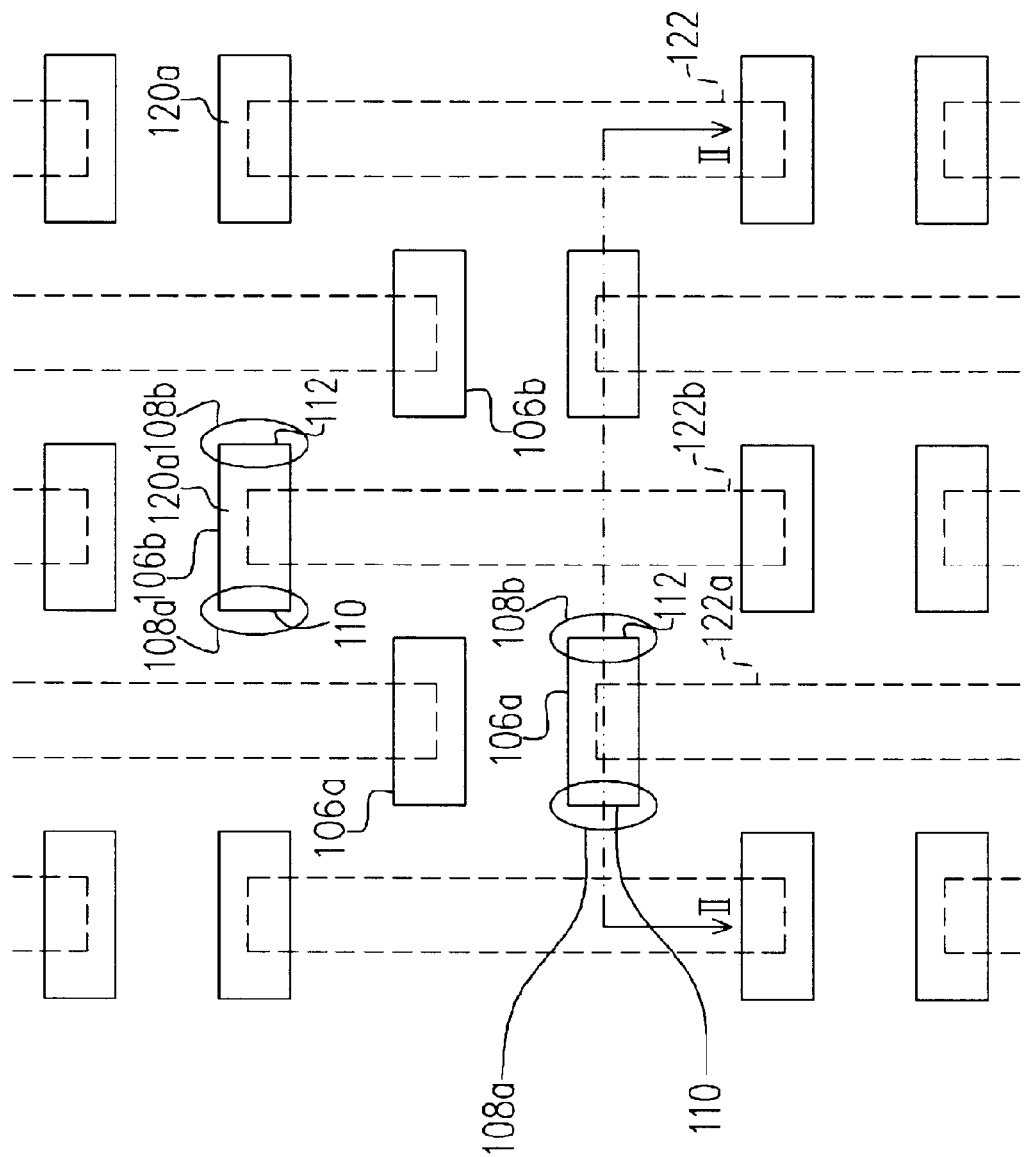
FIG. 2 is a top view of FIG. 1.

Referring to FIG. 1, a mask layer is formed on a substrate 100, wherein the mask layer is, for example, a pad oxide layer 102 and a silicon nitride layer 104 that are formed sequentially on the substrate 100. The pad oxide layer 102 is formed by, for example, a thermal oxidation method. The silicon nitride layer 104 is formed by, for example, a chemical vapor deposition method. The pad oxide layer 102 and the silicon nitride layer 104 are further patterned, and the substrate 100 is etched to form a plurality of deep trenches 106 in the substrate 100. The arrangement of the deep trenches 106 is, for example, a division into a plurality of columns. As shown in FIG. 2, the deep trenches 106a and the deep trenches 106b belong to different columns of deep trenches. For example, the deep trenches 106a belong to an even column, while the deep trenches 106b belong to an odd row. The region between two neighboring deep trenches 106 that are further apart is preserved as the active region. The shape of the deep trench 106 basically appears to be rectangular when being viewed from the top, wherein the corners can be rounded to form approximately an oval shape. The short sides 110 and 112 of the deep trench 106 are essentially parallel to the direction where the neighboring active region 122 is extended along. The regions where the diffusion of dopants of the electrode to the periphery in the substrate as often occurs in the prior art the circled regions in FIG. 2, and these regions are depicted by the reference number 108. The fabrication method of a deep trench capacitor of the present invention is intended to overcome the problems encountered in the prior art.

Still referring to FIG. 1, a doped region 108 is formed in the substrate 100 surrounding the bottom and the lower parts of the deep trench 106. The doped region 108 is formed as the bottom electrode of a capacitor. Thereafter, a dielectric layer 110 is formed of the surfaces of the bottom and the lower surface of the deep trench 108, followed by forming a first conductive layer 112 inside the trench 106, encompassed by the dielectric layer 110. The dielectric layer 110 and the conductive layer 112 are formed by, for example, forming a thin conformal dielectric layer and a conductive material that fills the trench 106, for example, a silicon oxide layer and a doped polysilicon layer. Thereafter, chemical mechanical polishing is conducted to remove the conductive material layer that covers the silicon nitride layer 104, followed by etching back a portion of the conductive material layer in the deep trench 106 to form the conductive layer 112. Thereafter, the dielectric layer disposed above the silicon nitride layer 104 and on the upper and middle parts of the deep trench 106 are removed by dipping, leaving behind only the dielectric layer 110 at the periphery of the first conductive layer 112. An annealing is then conductive to repair the first conductive layer 112, wherein the oxide layer is formed on the sidewall surface of the middle part and the upper part of the deep trench 106. The oxide layer becomes the oxide layer 114 after a subsequent dipping process.

Still referring to FIG. 1, a collar oxide layer 116 is then formed in the middle part of the deep trench 106 on the oxide layer 114. A conductive layer 118 is formed inside the deep trench 106, encompassed by the collar oxide layer 116. Forming the collar oxide layer 116 and the conductive layer 118 is by, for example, forming a chemically vapor deposited collar oxide layer 116 on the oxide layer 114. An etching-back process is then performed to remove the collar oxide layer that covers the surface of the conductive layer 112, leaving behind only the oxide layer 114 and the collar oxide 116 on the sidewall of the deep trench 106. Thereafter, a conductive material layer, for example, a doped polysilicon layer, is formed on the substrate 100. Chemical mechanical polishing is then conducted to remove the conductive material layer on the surface of the silicon nitride layer 104. An etching-back is further conducted, leaving behind the conductive layer 118 in the middle part of the deep trench 106. After removing the oxide layer 114 and the collar oxide layer 116 after dipping, only the oxide layer 114 surrounding the second conductive layer 118 and the collar oxide layer 116 remain.

Figure 3:
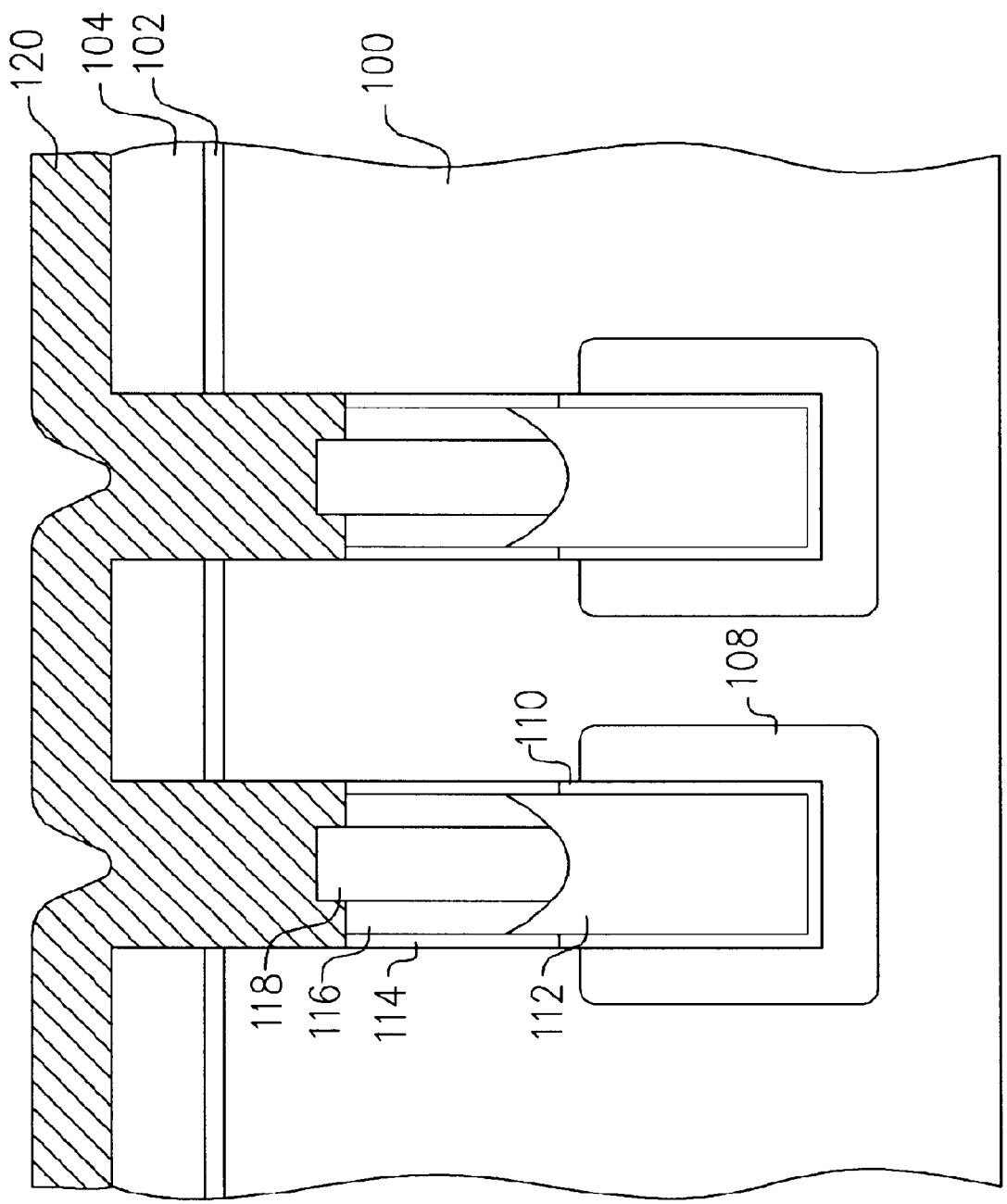

Referring to FIG. 3, an undoped semiconductor layer 120 is formed on the substrate 100, wherein the undoped semiconductor layer 120 is, for example, an undoped polysilicon layer formed by a chemical vapor deposition method.

Figure 4:
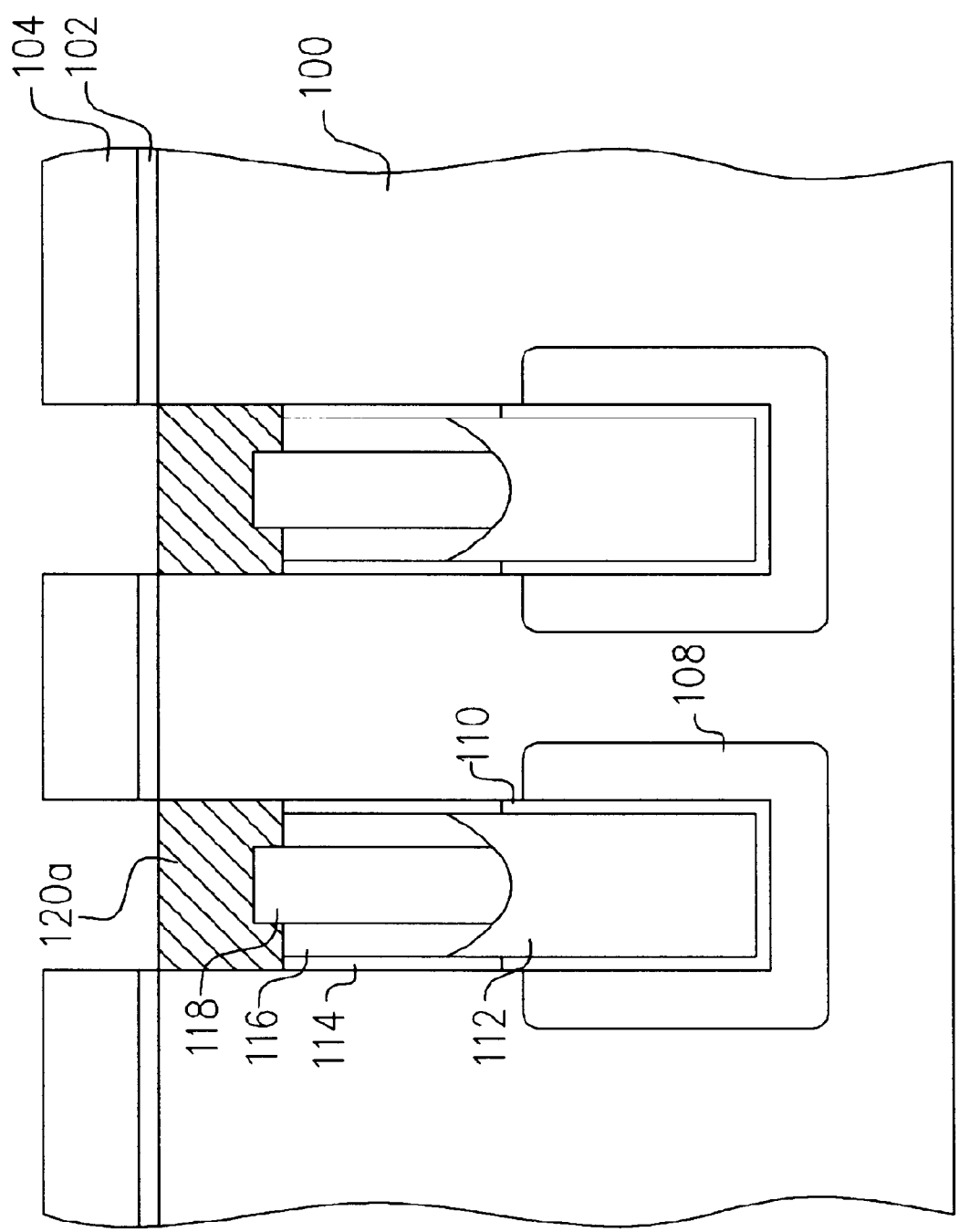
Figure 5:
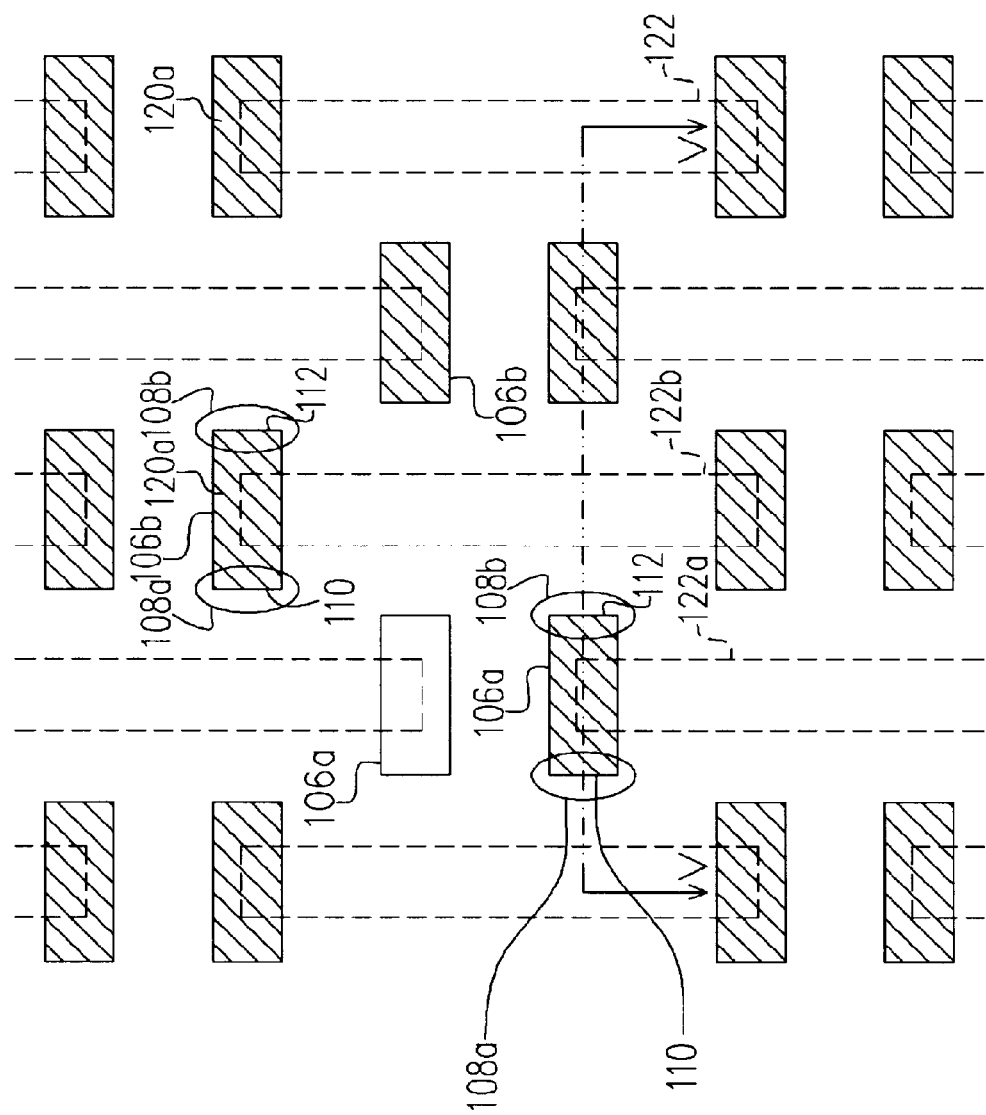
FIG. 5 is top view of FIG. 4.

Continuing to FIG. 4, the undoped semiconductor layer 120 outside the deep trench 106 is removed, leaving behind a portion 120a of the undoped semiconductor layer 120 in the upper part of the deep trench 106. The undoped semiconductor layer 120 is removed by, for example, performing a chemical mechanical polishing process first to remove the undoped semiconductor layer 120 that covers the silicon nitride layer 104, followed by an etching back process. Referring to FIG. 5, viewing from the top of the substrate 100, the substrate is covered by the patterned silicon nitride layer 104 that has openings for the deep trenches 106, and the semiconductor layer 120 that fills the deep trenches 106.

Figure 6:
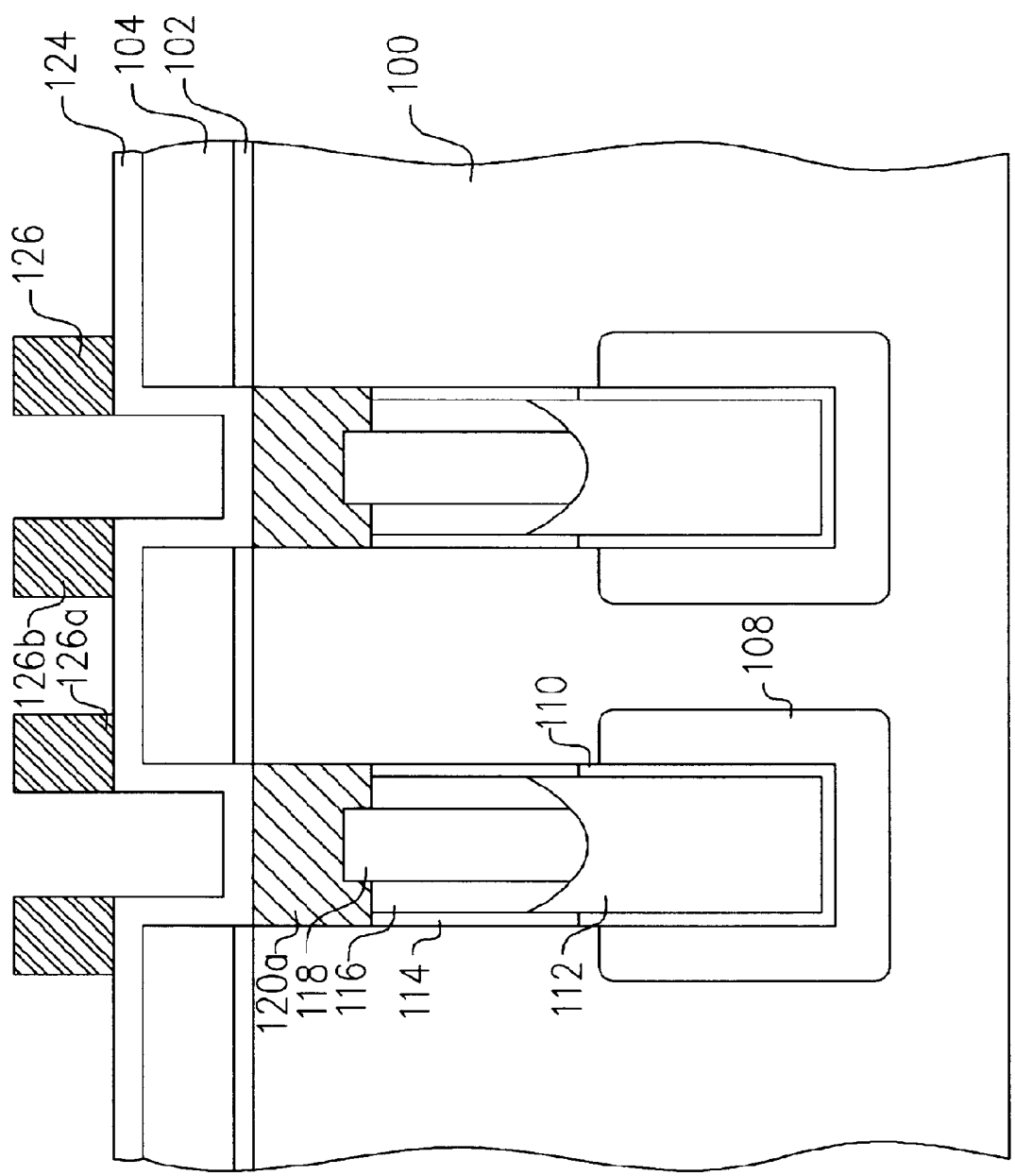

Thereafter, as shown in FIG. 6, a patterned mask layer, for example a patterned photoresist layer 126, is formed on the substrate 100. Preferably, an anti-reflection layer 124 is formed before forming the patterned photoresist layer 126.

Figure 7:
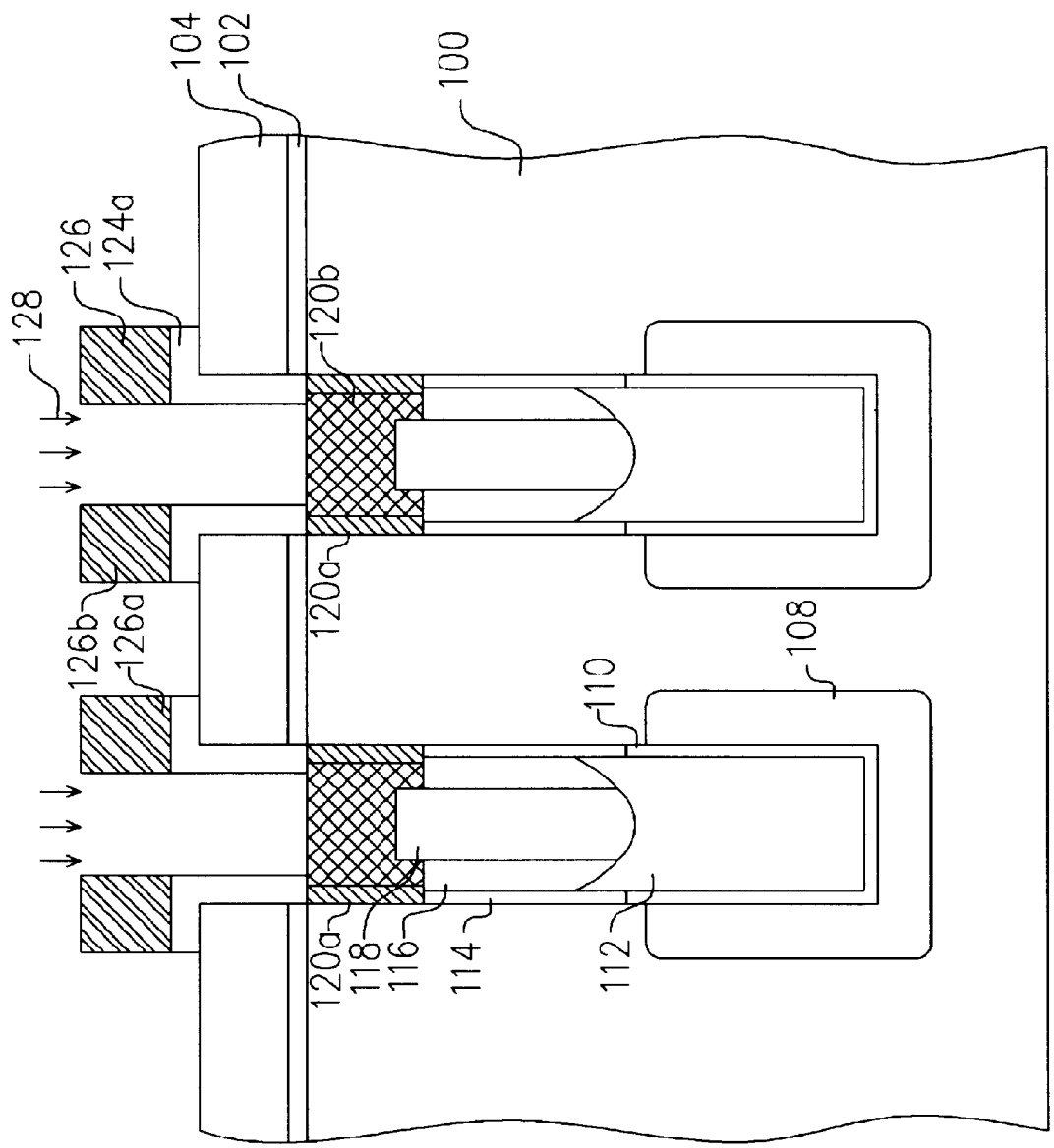

Referring to FIG. 7, the anti-reflection layer 124 not covered by the photoresist layer 126 is removed, leaving behind the anti-reflection layer 124a. An ion implantation process 128 is then conducted to implant dopants into the semiconductor layer 120a to form the conductive layer 120b, using the photoresist layer 126 and the silicon nitride layer 104 as an implantation mask.

Figure 8:
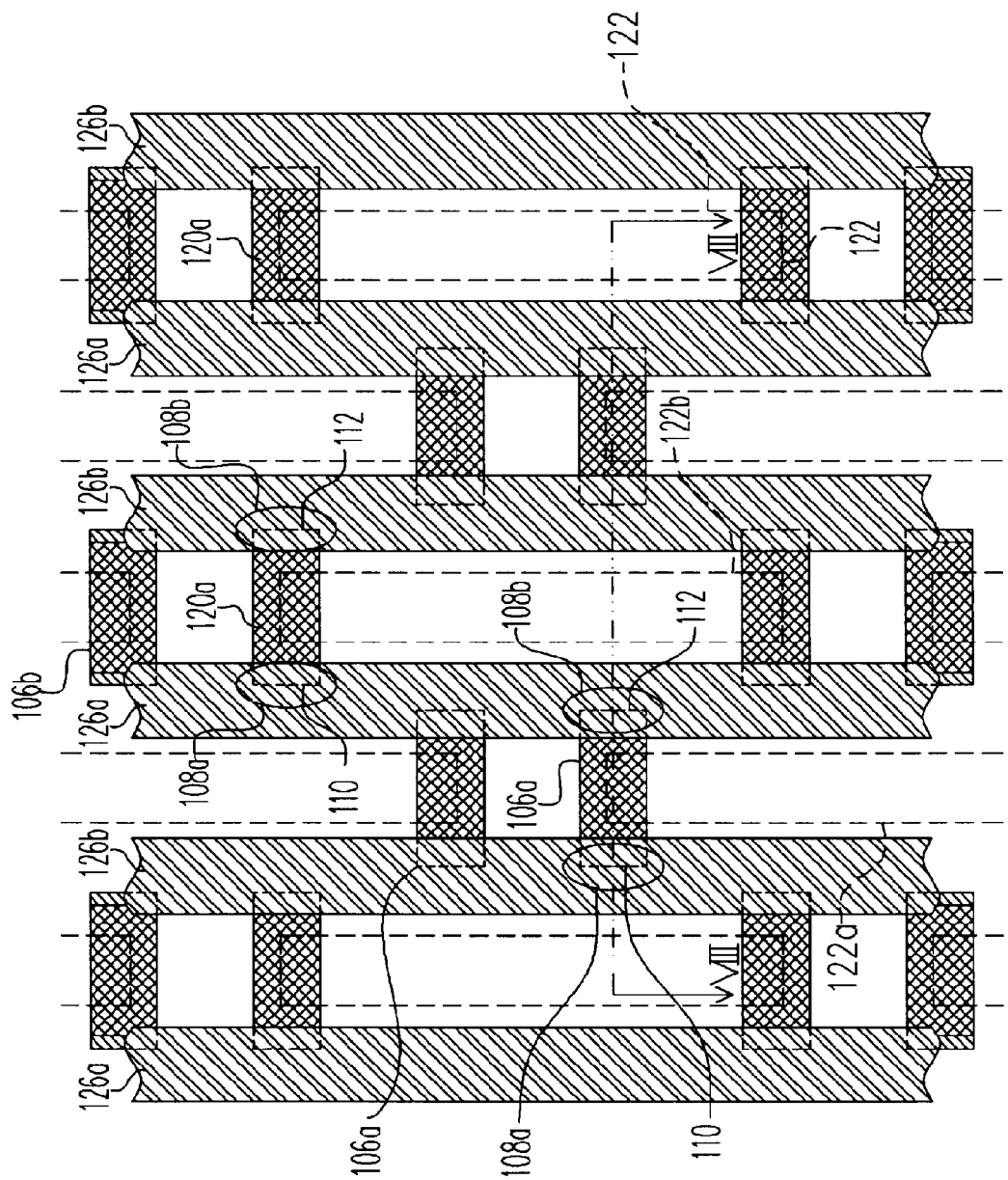
FIG. 8 is a top view of FIG. 7.

Referring to FIG. 8, it is important to note that the photoresist layer 126 covers the region 108 of the deep trenches 106, wherein the region 108 refers to the borders of the deep trenches that are adjacent to the predefined region for the active region 122. Using the deep trench 106a as an illustration, the borders of the deep trench 106a that are adjacent to the edges of the active region 122b, are regions 108a and 108b at the short side 110 and the short side 112 of the rectangular deep trench 106a. In this aspect of the invention, the photoresist layer 126 is a long stripe, which covers the region between two neighboring columns of deep trenches 106. More specifically, the region 108b at the short side 112 of the deep trench 106a and the region 108a at the short side 110 of a neighboring deep trench 106b are covered by the long, stripe-shaped photoresist layer 126. When the ion implantation process 128 is conducted, the undoped semiconductor layer 120a inside the deep trench 106 not covered by the photoresist layer 126 is going to be doped to form the conductive layer 120b, whereas the undoped semiconductor layer 120a inside the deep trench 120a covered by the photoresist layer 126 is not going to be doped. The conductive layer 120b, the conductive layer 118 and the conductive layer 112 serve as the upper electrode of the capacitor.

Figure 9:
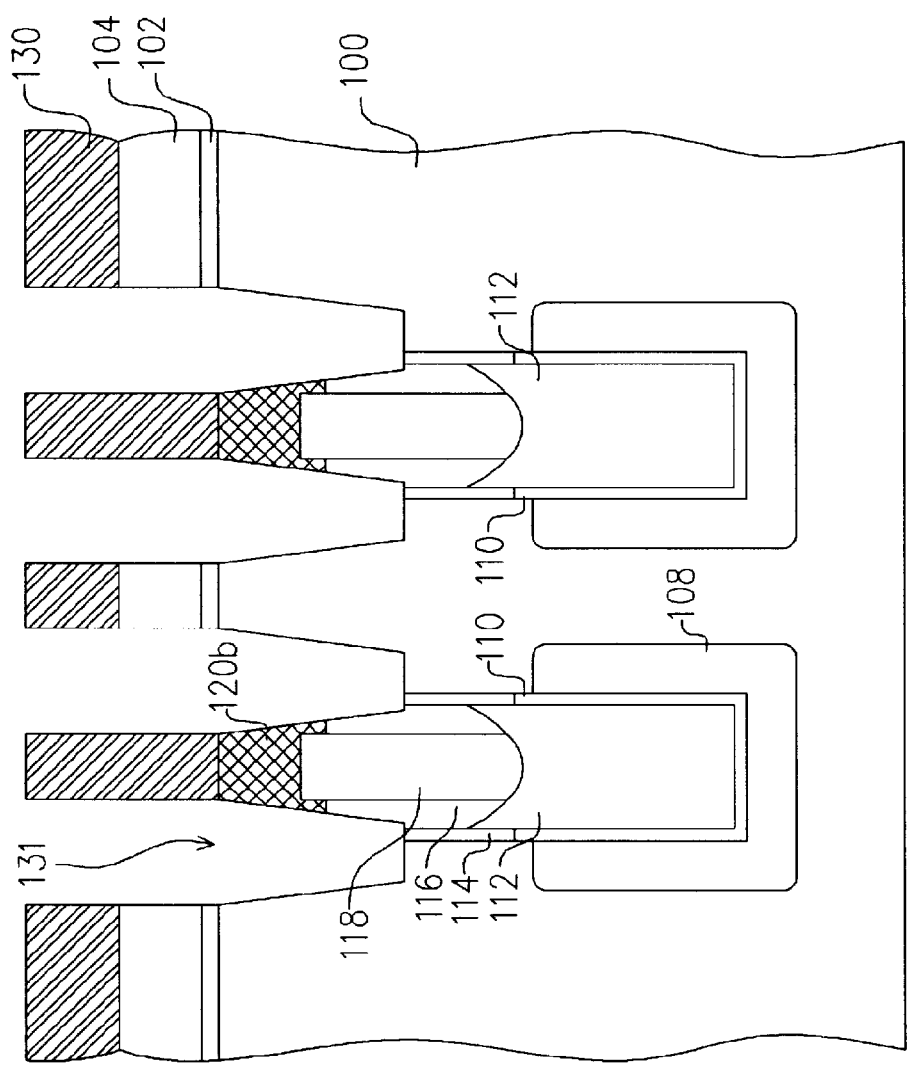
Figure 10:
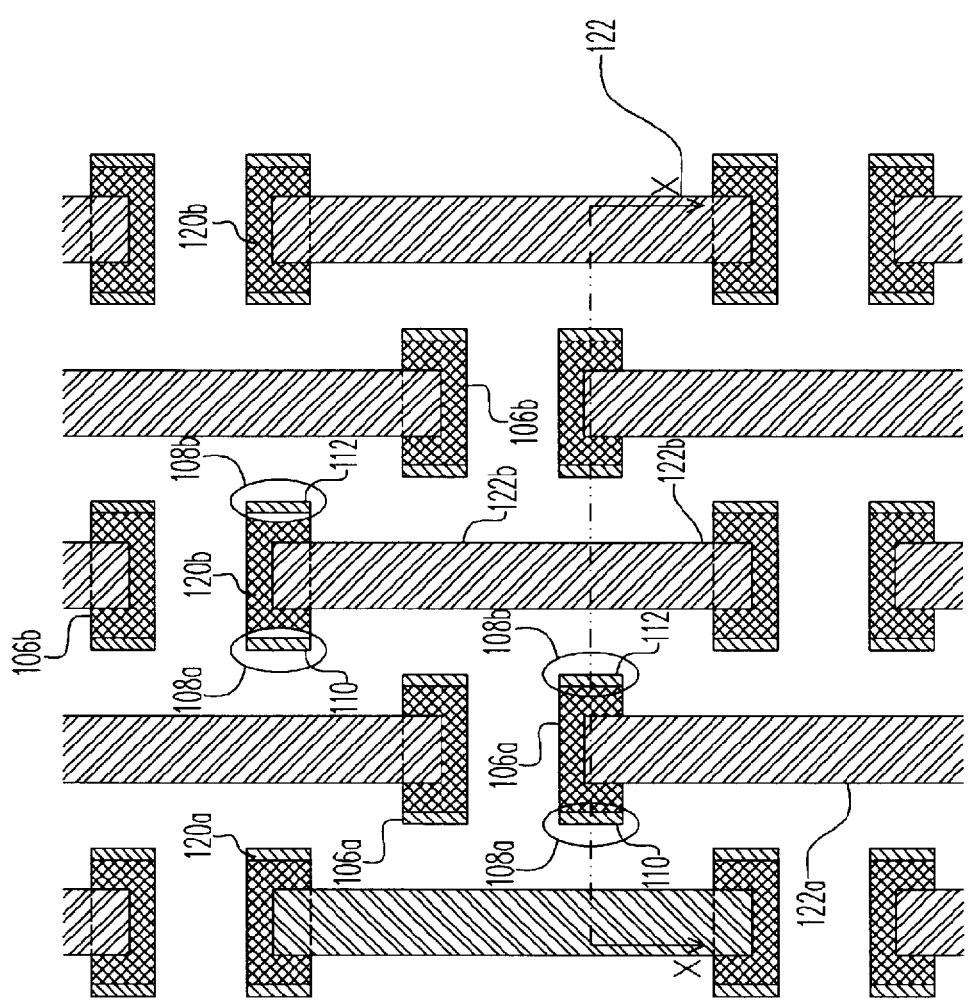
FIG. 10 is a top view of FIG. 9.

Referring to both FIGS. 9 and 10, the photoresist layer 126 and the antireflection layer 124 are removed, and another mask layer 130 is formed on the substrate 100 to define the active region 122. The mask layer 130 is, for example, a photoresist layer, which covers the predefined region for the active region 122. In other words, the mask layer 130 covers a portion of the conductive the 120b inside the deep trenches 106, and the silicon nitride layer 104 between two neighboring deep trenches 106 that are along a same column but at a further distance apart. Using the mask layer 130 as an etching mask, the silicon nitride layer 104 not covered by the mask layer 130 and the underlying pad oxide layer 102 and the substrate, and the undoped semiconductor layer 120a not covered by the mask layer 130 and the conductive layer 120b are etched to form shallow trenches 131 in the substrate 100.

Figure 11:
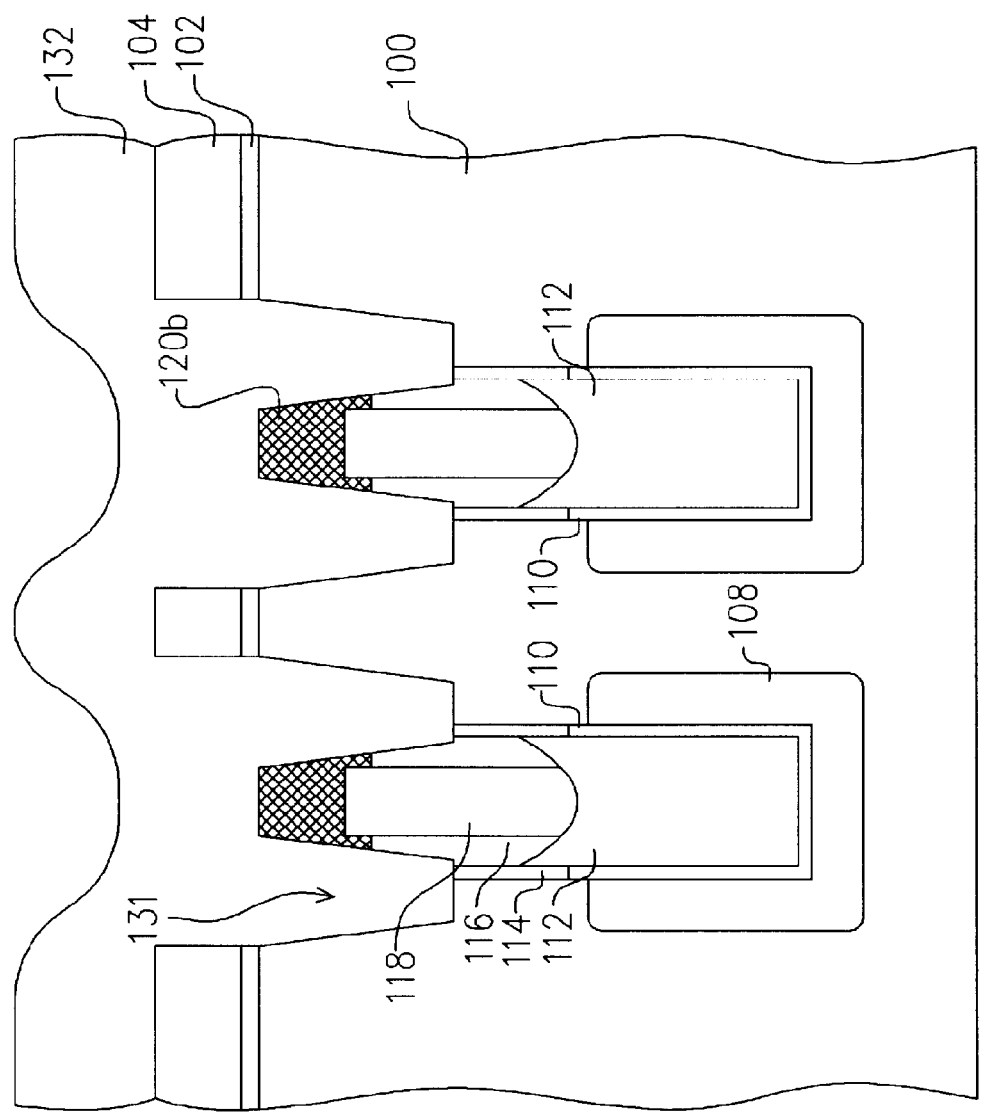

Referring to FIG. 11, an insulation layer 132 is formed over the substrate 100 to cover the silicon nitride layer 104 and to fill the shallow trenches 131. The insulation layer is, for example, silicon oxide, and is formed by a method, such as, high density plasma chemical vapor deposition (HDPCVD).

Figure 12:
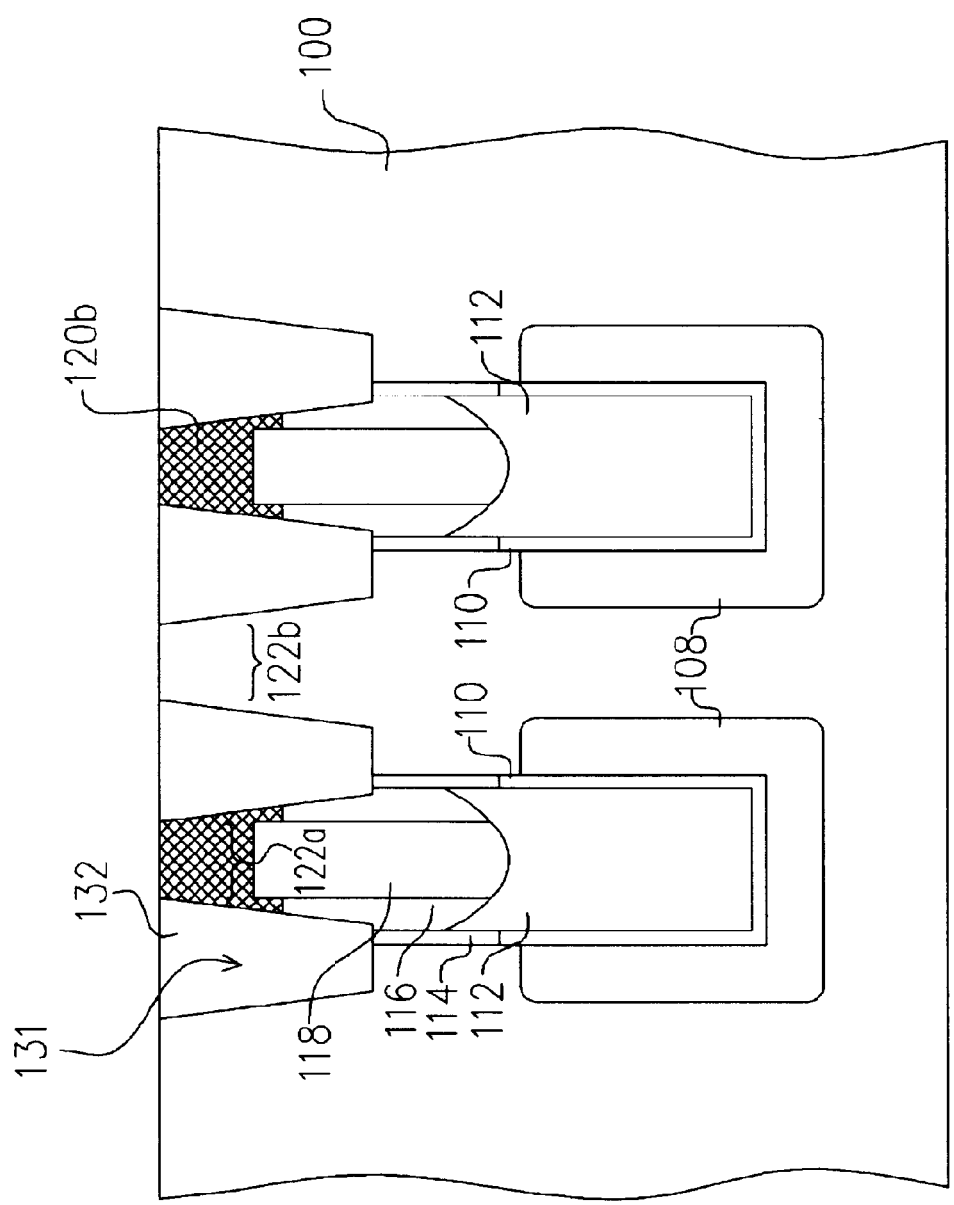

Referring to FIG. 12, chemical mechanical polishing is then conducted to remove the insulation layer 132 that covers the silicon nitride layer 104. An etching-back is conducted, the insulation layer 132a that remains inside the shallow trench 131 forms the isolation structure. After the formation of the isolation structure 132a, a plurality of active regions is defined on the substrate 100.

Figure 13:
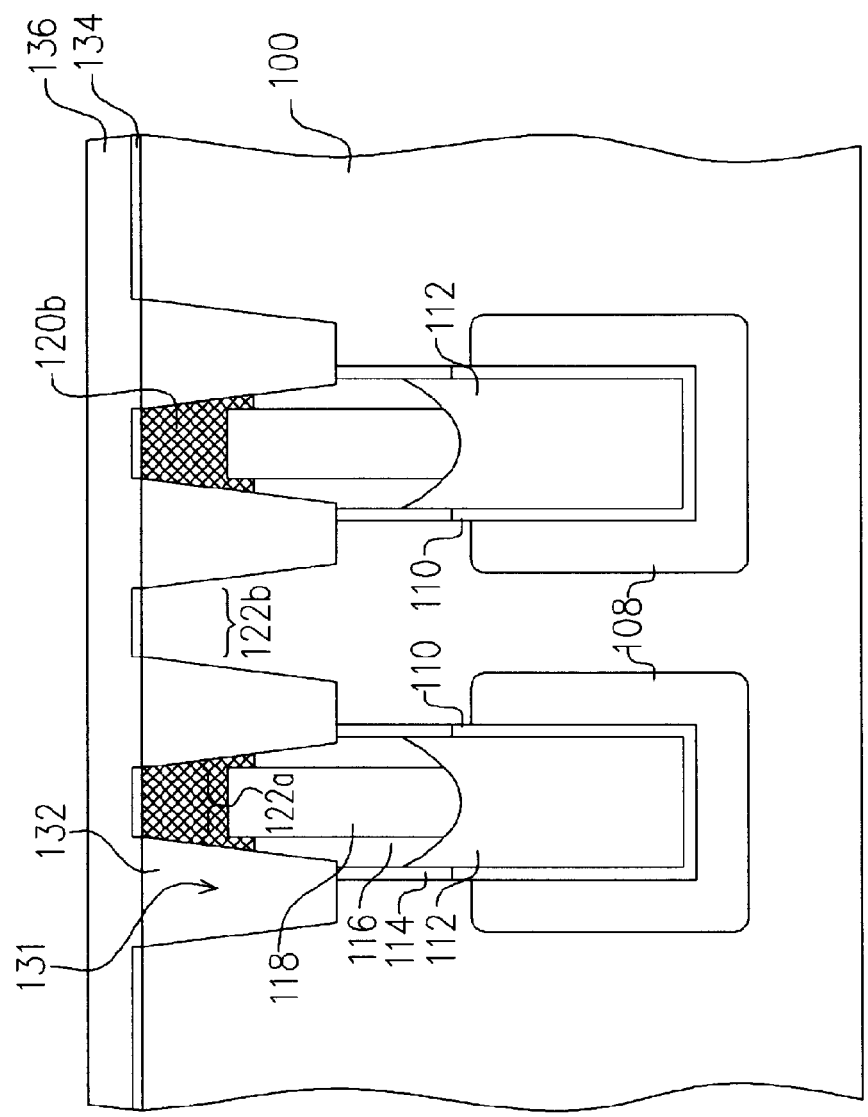
Figure 14:
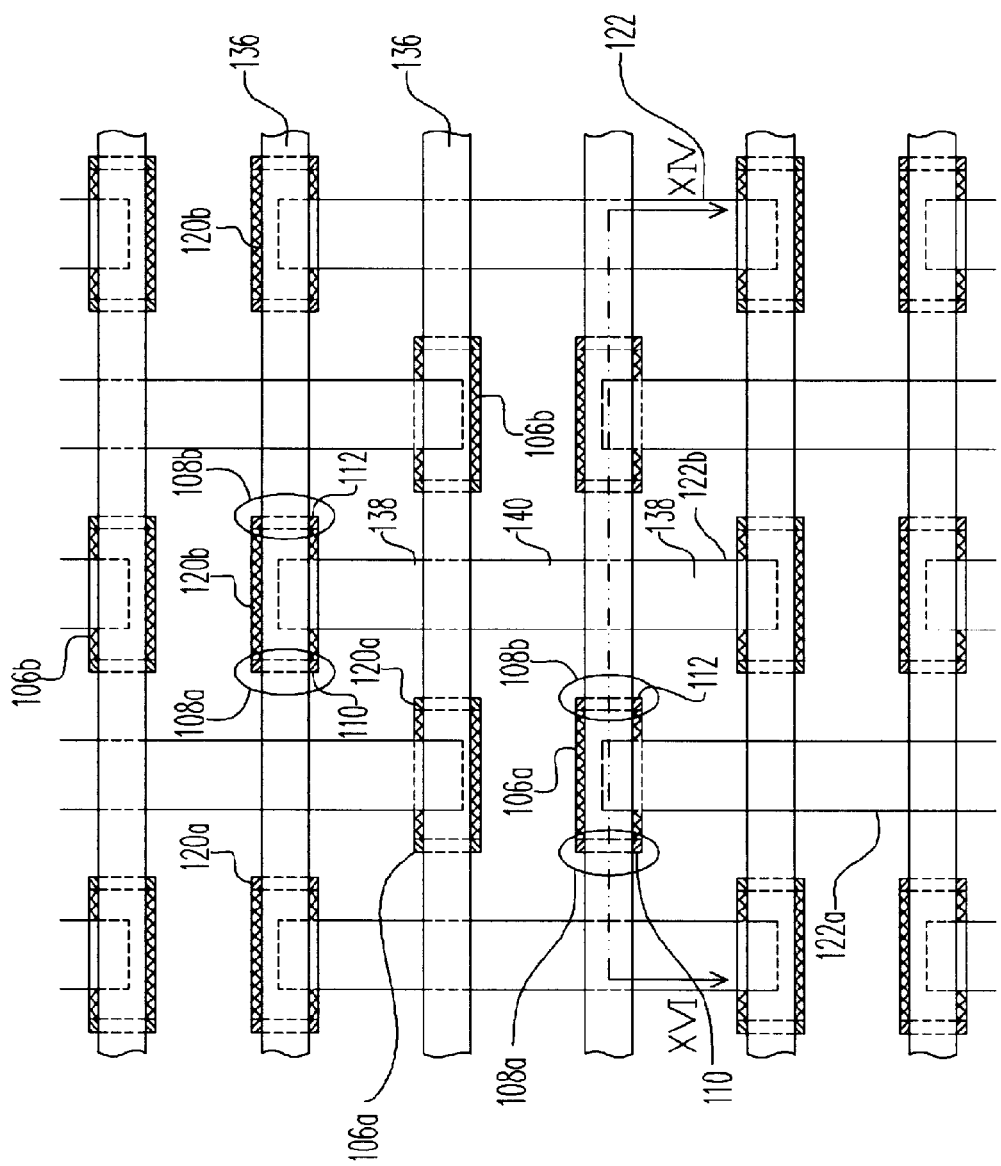
FIG. 14 is a top view of FIG. 13.

Thereafter, referring to FIG. 13 and FIG. 14, the silicon nitride layer 104 and the pad oxide layer 102 are removed. A gate dielectric layer 134 is formed on the active region 122, followed by forming a patterned gate conductive layer 136. The gate conductive layer 136 is formed with a material, such as, doped polysilicon, by a method, for example, chemical vapor deposition. The gate conductive layer 136 extends along the row direction; in other words, the gate dielectric layer 136 is perpendicular to the direction at which the active region 122 is extended. The gate dielectric layer 136 crosses over two rows of gate conductive layer 136. For each active region 122, two rows of gate dielectric layer 136 are formed thereabove. Source/drain regions 138, 140 are further formed in the active region 122, followed by forming contact windows above the source/drain regions 138/140. Therefore, back-end process is continued according to the conventional techniques, and the details of which not be reiterated here.

According to the aforementioned embodiment of the invention, a larger overlay margin is provided during the defining of the active region 122. This is because, as shown in FIG. 10, the regions 108 of the conductive layer 120b that are adjacent to both edges of the neighboring active region 122 comprise the undoped semiconductor layer 120a. The undoped semiconductor layer 120a thereby serves as a buffer layer, which can prevent the direct diffusion of dopants in the conductive layer 120b to the periphery of the trenches 160 in the substrate 100. Therefore, in the subsequent defining of the active region, even though a misalignment occurs and the active region 122 is defined on the border of the deep trenches 106, the channel region of the defined active region 122 will not contain any arsenic dopants because the border of the deep trenches 106 is an undoped semiconductor layer 120a. Therefore, the channel region of the defined active region 122 does not contain the arsenic dopants. As a result, the diffusion of dopants to periphery of the deep trenches, leading to the problem of the sub-threshold voltage as in the prior, is prevented. Beside the defined active region 122 comprises a larger overlay margin, the dimension of the capacitor can be increased. Further, the dimension of the capacitor is prevented from being reduced due to a small overlay margin. Therefore, the present invention is applicable for the fabrication of the next generation deep trench capacitor, and can accommodate the demand for miniaturization.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a memory device that comprises a deep trench, the method comprising:

providing a substrate;

forming a plurality of deep trenches in the substrate, wherein the deep trenches are rectangular shape when viewing from a top, and each trench comprises a first short side and a second short side, and between the first short side and the second short side of any two corresponding deep trenches is a pre-defined region for an active region;

forming a doped region in the substrate around a lower part and a bottom part of each deep trench;

forming a conformal dielectric layer on a bottom part and a sidewall of the lower part of each deep trench;

forming a first conductive layer in the bottom part and the lower part of the deep trench encompassed by the first dielectric layer;

forming a collar oxide layer at a periphery of a middle pair of each deep trench;

forming a second conductive layer in each deep trench, encompassed by the collar oxide layer;

forming an undoped semiconductor layer in the upper part of each deep trench;

implanting dopants into the undoped semiconductor layer, except at the periphery of the first short side and the second short side of each deep trench, to form a third conductive layer;

removing a portion of the third conductive layer, a portion of the collar oxide layer and a portion of the substrate inside the deep trenches to form a plurality of shallow trenches in the substrate; and filling in an insulation layer in each of the shallow trenches to form a plurality of isolation structures and to define a plurality of active regions in the pre-defined region for the active region.

2. The method of claim 1, wherein forming the deep trenches in the substrate comprises:

forming a patterned first mask layer on the substrate, wherein the patterned first mask layer comprises a plurality of first openings; and transferring the first opening pattern of the first mask layer to the substrate to form the deep trenches in the substrate.

3. The method of claim 1, wherein implanting dopants into the undoped semiconductor layer, except at the periphery of the first short side and the second short side of each deep trench further comprises:

forming a second mask layer on the first mask layer, wherein the second mask layer covers the periphery of the first short side and the second short side of the deep trenches;

performing an ion implantation process to implant dopants into the undoped semiconductor layer to form the third conductive layer, using the second mask layer and the first mask layer as an implantation mask; and removing the first mask layer and the second mask layer.

4. The method of claim 3, wherein forming the second mask layer further comprises:

forming an anti-reflection layer on the substrate;

forming a patterned photoresist layer on the anti-reflection layer, wherein the patterned photoresist layer exposes a portion of the anti-reflection layer in the deep trenches; and removing the anti-reflection the is not covered by the patterned photoresist layer to expose a portion of the undoped semiconductor layer.

5. The method of claim 3, wherein the deep trenches comprise neighboring a first column of a plurality of trenches and a second column of a plurality of trenches, and the second mask comprises a first long stripe mask and a second long stripe mask, and the first long stripe mask covers the undoped semiconductor layer at the periphery of the first short side of the deep trenches of the first column and the undoped semiconductor layer at the periphery of the second short side of the deep trenches of the second column, and the second long stripe mask covers the undoped semiconductor layer at the periphery of the second short side of the deep trenches of the first column and the undoped semiconductor layer at the periphery of the first short side of the deep trenches of the neighboring second column.

6. The method of claim 2, wherein forming the undoped semiconductor layer in the upper part of each deep trench further comprises:

forming an undoped semiconductor material layer on the substrate, wherein the undoped semiconductor material layer fills the deep trenches and covers the first mask layer; and performing a removing process to remove the undoped semiconductor material layer on the first mask layer and a portion of the undoped semiconductor material layer in the deep trenches.

7. The method of claim 6, wherein removing the portion of the undoped semiconductor material layer further comprises:

performing a chemical mechanical polishing process to remove the undoped semiconductor material layer that covers the first mask layer; and performing an etching-back process to remove the undoped semiconductor material layer in the deep trenches.

8. The method of claim 2, wherein forming the shallow trenches in the substrate comprises:

forming a third mask layer on the substrate, wherein the third mask layer comprises a second opening that exposes a portion of the third conductive layer, a portion of the collar layer and a portion of the first mask layer in the deep trenches; and removing the portion of the third conductive layer, the portion of the collar layer and the portion of the first mask layer in the deep trenches exposed by the second opening to form the shallow trenches in the substrate.

9. The method of claim 1, wherein the method further comprises:

forming a gate dielectric layer on each active region;

forming two patterned gate conductive layers on each gate dielectric layer; and forming a plurality of source/drain regions in the substrate beside two sides of the patterned gate conductive layer.

10. A fabrication method for a memory device that comprises a deep trench capacitor, the fabrication method comprising:

providing a substrate;

forming a plurality of deep trenches in the substrate, wherein the deep trenches is differentiated into a plurality of a first column of the deep trenches and a plurality of a second column of the deep trenches, and the first column of the deep trenches and the second column of the deep trenches are arranged alternately;

forming a doped region in the substrate, around a lower part and a bottom part of each deep trench;

forming a conformal dielectric layer on the bottom part and a sidewall of the lower part of each deep trench;

forming a first conductive layer in the lower part and the bottom part of each deep trench, encompassed by the dielectric layer;

forming a collar oxide layer at a periphery of a middle part of each deep trench;

forming a second conductive layer in each trench, encompassed by the collar oxide layer;

forming an undoped semiconductor layer in an upper part of each trench;

implanting dopants into a part of the undoped semiconductor layer; and defining a plurality of active regions in the substrate, wherein the active region extends from one deep trench to a neighboring deep trench along a same column, wherein the one deep trench and the neighboring deep trench are at a greater distance apart, wherein a border of the deep trench that is adjacent to the neighboring active region is a first region, and during the implantation of the dopants into the undoped semiconductor layer, the undoped semiconductor layer of the first region is not doped with the dopants.

11. The method of claim 10, wherein forming the deep trenches in the substrate further comprises:

forming a patterned first mask layer on the substrate, wherein the patterned mask layer comprises a plurality of first openings; and transferring the first opening pattern of the first mask layer to the substrate to form the deep trenches in the substrate.

12. The method of claim 11, wherein the step of implanting the dopants into the part of the undoped semiconductor layer comprises:

forming a second mask layer on the first mask layer, and the second mask layer covers the undoped semiconductor layer of the first region;

performing an ion implantation process to implant dopants into the undoped semiconductor layer outside the first region to form a third conductive layer in each of the trenches using the second mask layer and the first mask layer as an implantation mask; and removing the first mask layer and the second mask layer.

13. The method of claim 12, wherein the step of forming the second mask layer comprises:

forming an anti-reflection layer on the substrate; and forming a patterned photoresist layer on the anti-reflection layer, wherein the patterned photoresist layer exposes a portion of the undoped semiconductor layer.

14. The method of claim 12, wherein the second mask is a mask with a plural of long stripes which cover the undoped semiconductor layer of the neighboring first region between the deep trenches of any two neighboring deep trenches of the first column and of the second column.

15. The method of claim 11, wherein forming the undoped semiconductor layer in the upper part of each deep trench comprises:

forming an undoped semiconductor material layer on the substrate to fill the trenches and to cover the first mask layer; and performing a partial removing step to remove the undoped semiconductor material layer that covers the first mask layer and a portion of the undoped semiconductor material layer in the deep trenches.

16. The method of claim 15, wherein the step of performing the partial removing step further comprises:

performing a chemical mechanical process to remove the undoped semiconductor material layer the covers the first mask layer; and performing an etching-back process to remove the portion of the undoped semiconductor material layer in the deep trenches.

17. A fabrication method for an electrode of a deep trench capacitor, the method comprising:

providing a substrate;

forming a plurality of deep trenches in the substrate, and the deep trenches arranging into a plurality of columns, wherein between the deep trench and the neighboring deep trenches that are at a greater distance apart on a same column is an active region, and a border of each deep trench that is adjacent to the active region as a first region;

forming a first conductive layer in a lower part and a middle part of each deep trench;

forming an undoped semiconductor material layer in an upper part of each deep trench;

forming a mask layer on the undoped semiconductor material layer;

performing an ion implantation process to implant dopants into the undoped semiconductor material layer outside of the first region to form a second conductive layer and an undoped semiconductor layer in the first region, wherein the first conductive layer and the second conductive layer serve as the electrode of the deep trench capacitor; and removing the second mask layer to expose the undoped semiconductor material layer.

18. The method of claim 17, wherein forming the undoped semiconductor material layer in the upper part of each deep trench further comprises:

forming a material layer on the substrate, filling the deep trenches and covering the substrate; and performing a partial removal process to remove the material layer the covers the substrate and the portion of the material layer in the deep trenches.

19. The method of claim 18, wherein the partial removal process further comprises:

performing a chemical mechanical process to remove the material layer that covers the substrate; and performing an etching-back process to remove the portion of the material layer in the deep trenches.

* * * * *